United States Patent [19]

Vaughn

[11] Patent Number: 4,539,489

[45] Date of Patent: Sep. 3, 1985

[54] CMOS SCHMITT TRIGGER CIRCUIT

[75] Inventor: Herchel A. Vaughn, Austin, Tex.

[73] Assignee: Motorola, Inc., Schaumburg, Ill.

[21] Appl. No.: 506,745

[22] Filed: Jun. 22, 1983

[51] Int. Cl.³ .................... H03K 3/356; H03K 3/295
[52] U.S. Cl. .................................... 307/290; 307/359
[58] Field of Search ............... 307/290, 358, 359, 547, 307/555, 562

[56] References Cited

U.S. PATENT DOCUMENTS 4,369,381 1/1983 Okamoto et al. .................. 307/290

Primary Examiner—John Zazworsky
Attorney, Agent, or Firm—Anthony Sarli, Jr.; Jeffrey Van Myers; James L. Clingan, Jr.

[57] ABSTRACT

A CMOS Schmitt trigger which has two series-connected inverters uses both an input and an output signal to provide hysteresis. A pair of series-coupled transistors is coupled between a power supply terminal and a node between the two inverters. One of the transistors has a control electrode for receiving the input signal. The other of the transistors has a control electrode for receiving the output signal.

3 Claims, 1 Drawing Figure

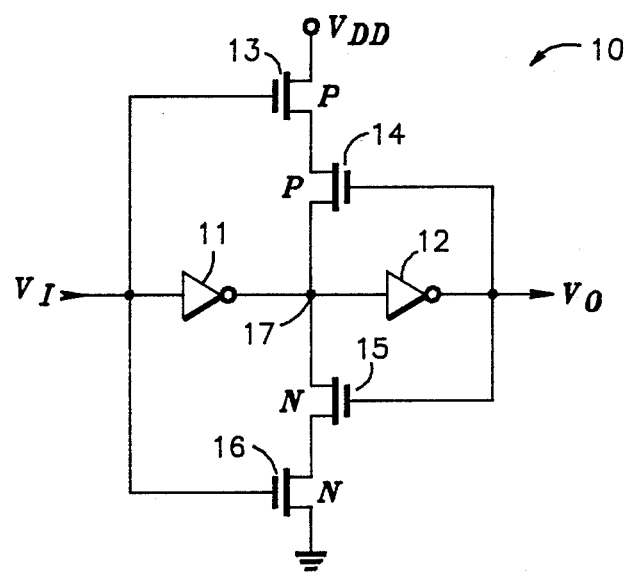

CMOS SCHMITT TRIGGER CIRCUIT

FIELD OF THE INVENTION

The subject invention relates to Schmitt triggers, and more particularly, to Schmitt triggers which use CMOS technology.

BACKGROUND OF THE INVENTION

Schmitt triggers are often used to increase noise immunity for noisy and/or slow moving signals. This is achieved by providing hysteresis which effectively raises the threshold voltage (or switch point) when a logic low is present and lowers the switch point when a logic high is present. A conventional CMOS Schmitt trigger uses a weak P channel device and a weak N channel device for feedback to change the switch point of the circuit. The amount of hysteresis is adjusted by adjusting the gain of the feedback transistors.

It has been found, however, that at low power supply voltages the feedback transistors must be very weak in order for the circuit to switch at all, or at least within acceptable limits. If very weak devices are used, there is very little hysteresis at higher voltages. Consequently, if it is desirable to be able to have an operating range of several volts in which a relatively low voltage is the low end of the range, the amount of hysteresis can only be very small.

SUMMARY OF THE INVENTION

An object of the subject invention is to provide an improved Schmitt trigger.

Another object of the invention is to provide a CMOS Schmitt trigger with improved hysteresis characteristics.

Yet another object of the invention is to provide a CMOS Schmitt trigger with improved operation at low voltage.

These and other objects of the subject invention are achieved in a Schmitt trigger which has a first inverter which has an input for receiving an input signal, and an output coupled to a control node. A second inverter has an input coupled to the control node, and an output for providing an output signal. A pair of series-coupled transistors of a first conductivity type are coupled between a first power supply terminal and the control node. One of the pair has a control electrode for receiving the input signal. The other of the pair has a control electrode for receiving the output signal.

BRIEF DESCRIPTION OF THE DRAWING

The sole FIGURE is a circuit diagram of a CMOS Schmitt trigger according to a preferred embodiment of the invention.

DESCRIPTION OF A PREFERRED EMBODIMENT

Shown in the sole FIGURE is a Schmitt trigger circuit 10 comprised of an inverter 11, an inverter 12, a P channel transistor 13, a P channel transistor 14, an N channel transistor 15, and an N channel transistor 16. Inverter 11 has an input for receiving an input signal $V_I$, and an output connected to a control node 17. Inverter 12 has an input coupled to node 17, and an output for providing an output signal $V_O$. Transistor 13 has a source connected to a positive power supply terminal $V_{DD}$ for receiving a positive power supply voltage, a gate connected to the input of inverter 11, and a drain. Transistor 14 has a source connected to the drain of transistor 13, a gate connected to the output of inverter 12, and a drain connected to node 17. Transistor 15 has a drain connected to node 17, a gate connected to the output of inverter 12, and a source. Transistor 16 has a drain connected to the source of transistor 15, a gate connected to the input of inverter 11, and a source connected to a negative power supply terminal shown as ground. Transistors 15 and 16 have a threshold voltage between 0.4 and 0.8 volt. Transistors 13 and 14 have a threshold voltage between −0.4 and −0.8 volt. Inverters 11 and 12 are conventional CMOS inverters. In the particular embodiment described herein, each of the transistors has a gate length of 3 microns, and the voltage range at $V_{DD}$ is from 3 to 6 volts.

When signal $V_I$ is a logic high, the output of inverter 11 is a logic low which in turn causes inverter 12 to provide signal $V_O$ at a logic high. With signals $V_I$ and $V_O$ both at a logic high, transistors 15 and 16 are turned on, and transistors 13 and 14 are turned off. When signal $V_I$ is a logic low, inverter 11 provides a logic high on its output which in turn causes inverter 12 to provide signal $V_O$ at a logic low. With signals $V_I$ and $V_O$ at a logic low, transistors 15 and 16 are turned off, and transistors 13 and 14 are turned on. When signals $V_I$ and $V_O$ are both in a logic high state, circuit 10 is referred to as being in a logic high state. When signals $V_I$ and $V_O$ are both in a logic low state, circuit 10 is referred to as being in a logic low state. In the logic high state, circuit 10 has a switch point which is lowered by series-coupled transistors 15 and 16 being turned on. In the logic low state, circuit 10 has a switch point which is raised by series-coupled transistors 13 and 14 being turned on. Typical CMOS inverters, such as inverters 11 and 12, have switch points determined by ratioing the sizes of the P and N channel transistors which comprise typical CMOS inverters. If transistors 13–16 were not present, the switch point of circuit 10 would be the same as that of inverter 11. When inverter 11 switched logic states, inverter 12 would also immediately respond by switching logic states. The switch point of inverter 12 would be crossed immediately.

Transistors 13 and 14, when turned on, increase the amount of current that inverter 11 must sink in order to switch states in the case where signal $V_O$ is switching from a logic low to a logic high. Signal $V_I$ must reach a higher voltage level before inverter 11 will cause the voltage at node 17 to cross the switch point of inverter 12. Transistors 13 and 14 can be made relatively large so as to have a significant impact on the switch point. When the voltage at $V_{DD}$ is at the low end of the voltage range, transistor 13 provides significant current limiting so that inverter 11 can switch logic states. In the case where the source of transistor 14 is directly connected to $V_{DD}$, too much current is supplied to node 17 for a reasonable switch point if transistor 14 has the amount of gain necessary for a significant impact on the switch point of circuit 10. In either case transistor 14 is turned on quite hard by signal $V_O$ until circuit 10 switches to a logic high state. With circuit 10, however, transistor 13 begins providing significant current limiting as signal $V_I$ increases in voltage.

Transistors 15 and 16 provide substantially the same effect as transistors 13 and 14 except transistors 15 and 16 reduce the switch point of circuit 10 when signal $V_I$ is a logic high. When circuit 10 is in a logic high state, transistors 15 and 16 are both turned on which increases the amount of current that must be provided to node 17 by inverter 11 in order to reach the switch point of inverter 12. Signal $V_I$ must reach a lower level before enough current is supplied to node 17 to reach the switch point of inverter 12. Again, transistor 16, which is analogous to transistor 13, provides an improvement which allows relatively large gain from transistors 15 and 16 so as to have a significant impact on the switch point of circuit 10. As signal $V_I$ begins lowering in voltage transistor 16 begins limiting the current that is drawn from node 17. This allows node 17 to rise sufficiently to reach the switch point of inverter 12.

The amount of hysteresis and the switch points of inverters 11 and 12 are achieved by sizing the various transistors. For example, for hysteresis of about 0.4 volt when $V_{DD}$ is at 5 volts, the channel width of transistors 13 and 14 was chosen to be 25 microns and the channel width of transistors 15 and 16 was chosen to be 8 microns. Inverter 11 had P and N transistors of 30 and 20 micron channel widths, respectively. Inverter 12 had P and N transistors of 30 and 10 micron channel widths, respectively. This was for a process in which N channel devices were approximately three times stronger than P channel devices which is a common ratio. It is to be understood that ratioing of the device sizes to obtain other desired results may also be done, and further that experimenting with different device sizes to achieve varying results is a conventional technique.

While the invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

I claim:

1. A Schmitt trigger comprising:
    a first inverter having an input for receiving an input signal, and an output coupled to a control node;
    a second inverter having an input coupled to the control node, and an output for providing an output signal; and
    a pair of series coupled transistors of a first conductivity type coupled between a first power supply terminal and the control node, with one of the pair having a control electrode for receiving the input signal and the other of the pair having a control electrode for receiving the output signal.

2. The Schmitt trigger circuit of claim 1 further comprising:
    a pair of series-coupled transistors of a second conductivity type coupled between a second power supply terminal and the control node with one of the pair having a control electrode for receiving the input signal and the other of the pair having a control electrode for receiving the output signal.

3. The Schmitt trigger circuit of claim 2 wherein the pair of series-coupled transistors of the first conductivity type are P channel transistors, the pair of series-coupled transistors of the second conductivity type are N Channel transistors, the first power supply terminal is for receiving a positive power supply voltage, and the second power supply terminal is ground.

* * * * *